United States Patent
Park et al.

(10) Patent No.: US 7,335,912 B2
(45) Date of Patent: Feb. 26, 2008

(54) ORGANIC LIGHT EMITTING DISPLAY HAVING IMPROVED VIA HOLE

(75) Inventors: Moon-Hee Park, Suwon-si (KR); Chang-Su Seo, Suwon-si (KR); Tae-Wook Kang, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 198 days.

(21) Appl. No.: 11/168,931

(22) Filed: Jun. 29, 2005

(65) Prior Publication Data

US 2006/0006540 A1 Jan. 12, 2006

(30) Foreign Application Priority Data

Jun. 30, 2004 (KR) .................. 10-2004-0050478

(51) Int. Cl.
*H01L 29/04* (2006.01)
*H01L 29/10* (2006.01)
*H01L 31/00* (2006.01)

(52) U.S. Cl. .............................. 257/59; 257/72
(58) Field of Classification Search ............ 257/59, 257/773, 774
See application file for complete search history.

(56) References Cited

U.S. PATENT DOCUMENTS 6,538,326 B2 * 3/2003 Shimizu et al. ............. 257/758

FOREIGN PATENT DOCUMENTS

| JP | 09-146118 | 6/1997 |
| JP | 2002-287663 A1 | 10/2002 |
| KR | 1020020030258 A1 | 4/2002 |

* cited by examiner

*Primary Examiner*—Jerome Jackson
*Assistant Examiner*—Anthony Ho
(74) *Attorney, Agent, or Firm*—H.C. Park & Associates, PLC

(57) ABSTRACT

An organic light emitting display including a semiconductor layer formed on a substrate, a first insulating layer formed on the substrate and including a contact hole, an electrode formed on the first insulating layer and coupled to the semiconductor layer through the contact hole, a second insulating layer formed on the first insulating layer and including a via hole, and a pixel electrode formed on the second insulating layer and coupled to the electrode through the via hole. The via hole is formed corresponding to the contact hole, and the via hole has a larger size than the contact hole.

17 Claims, 5 Drawing Sheets

ORGANIC LIGHT EMITTING DISPLAY HAVING IMPROVED VIA HOLE

CROSS REFERENCE TO RELATED APPLICATION

This application claims priority to and the benefit of Korean Patent Application No. 10-2004-0050478, filed on Jun. 30, 2004, which is hereby incorporated by reference for all purposes as if fully set forth herein.

BACKGROUND OF THE INVENTION

1. Field of the Invention

The present invention relates to an emissive type flat panel display device, and more particularly, to an organic light emitting display with a via hole that is larger than a contact hole in a structure where the via hole is formed corresponding to the contact hole.

2. Discussion of the Background

Generally, in an organic light emitting display (OLED), which is a flat panel display device, the size of cells may be reduced to increase resolution. Accordingly, sizes of a contact hole, which connects source/drain electrodes of a thin film transistor (TFT) to source/drain regions, and a via hole, which connects a TFT's source or drain electrode to a lower electrode of an organic electroluminescence device, may be reduced.

However, when the size of the via hole is reduced, a pattern defect may be generated when patterning the lower electrode, thereby decreasing the device's reliability. In a structure where the via hole is formed corresponding to the contact hole, the probability of generating the pattern defect may increase due to a step that is generated when forming the contact hole.

FIG. 1 is a cross-sectional view showing a conventional OLED.

Referring to FIG. 1, a buffer layer 105 is formed on an insulating substrate 100, and a semiconductor layer 110, including a source region 111 and a drain region 115, is formed on the buffer layer 105. A gate electrode 125, which corresponds to a channel region 117 of the semiconductor layer 110, is formed on a gate insulating layer 120. A source electrode 141 and a drain electrode 145 are electrically connected with the source and drain regions 111 and 115 through contact holes 131 and 135, respectively. The contact holes 131 and 135 are formed in an interlayer dielectric 130 and the gate insulating layer 120.

Additionally, a protective layer 150 and an overcoat 160 are sequentially formed on the interlayer dielectric 130. The protective layer 150 includes a first opening portion 155 that exposes a part of the drain electrode 145, and the overcoat 160 includes a second opening portion 165 that also exposes a part of the drain electrode 145.

A lower electrode 170 may be formed on the overcoat 160, and it may be electrically connected to the drain electrode 145 through a via hole 167. The lower electrode 170 is a pixel electrode, and it may include a metal reflective layer 171 and a transparent conductive layer 175. The reflective layer 171 may include a third opening portion 177 that exposes a part of the drain electrode 145.

A pixel defining layer 180, which is formed on the overcoat 160, includes a fourth opening portion 185 that exposes a part of the lower electrode 170. An organic layer 190, including a light emitting layer, is formed on the lower electrode 170 in the fourth opening portion 185, and an upper electrode 195 is formed on the insulating substrate 100.

FIG. 2A is a cross-sectional view, taken along line IIA-IIA of FIG. 2B, showing a part of the OLED of FIG. 1 corresponding to the contact hole and the via hole, and FIG. 2B is a plan view showing the contact hole and the via hole in the OLED of FIG. 1.

Referring to FIG. 2A and FIG. 2B, the conventional OLED may include the circular-shaped contact hole 135 and via hole 167, and the plan view area of the via hole 167 is contained within the plan view area of the contact hole 135. The contact hole 135 exposes the drain region 115 of the semiconductor layer 110 for connecting to the drain electrode 145, and it is formed in a gate insulating layer 120 and the interlayer dielectric 130 to have a size d11. The via hole 167 exposes the drain electrode 145 for connecting the drain electrode 145 to the lower electrode 170, and it includes the first opening portion 155, which is formed in the protective layer 150 and has a size d12, and the second opening portion 165, which is formed in the overcoat 160 and has a size d13.

Here, the size d11 of the contact hole 135 is a cross-sectional length of the drain region 115 that is exposed by the contact hole 135, and the size d12 of the first opening portion 155 is a cross-sectional length of the drain electrode 145 that is exposed by the first opening portion 155. Further, the size d13 of the second opening portion 165 is a cross-sectional length of the drain electrode 145 that is exposed by the second opening portion 165. Additionally, the size of the via hole 167 is a cross-sectional length of the drain electrode 145 that is exposed by the via hole 167. Thus, the second opening portion 165 has a smaller size d13 than the size d12 of the first opening portion 155, and the protective layer 150 is covered by the overcoat 160. Therefore, the size of the via hole 167 is determined by the size d13 of the second opening portion 165.

In a conventional front surface emissive type OLED, the lower electrode 170 may serve as the anode electrode, and it may have a stacked structure including a reflective layer 171, such as an AlNd layer, and a transparent conductive layer 175. However, when using an Al alloy, such as AlNd, as the lower electrode, an oxide layer, such as $Al_2O_3$, may form on an interface between the drain electrode 145 and the lower electrode 170, thus increasing contact resistance thereon.

In order to reduce the contact resistance, the reflective layer 171 may be patterned so that the transparent conductive layer 175 may be formed directly on the drain electrode 145 in the via hole 167. That is, the reflective layer 171 is deposited on the insulating substrate 100, a photoresist layer (not shown) is applied on the reflective layer 171, and a photolithography process is performed to pattern the photoresist. Here, the photoresist layer located on the portion of the insulating substrate 100 corresponding to the via hole 167 is patterned to be removed. Additionally, the reflective layer 171 is patterned to have the third opening portion 177 that exposes the drain electrode 145 in the via hole 167 using the patterned photoresist layer.

Removing the portion of the reflective layer 171 contacting the drain electrode 145 may solve the contact resistance problem. However, in the front surface emissive type OLED, in which the via hole 167 is formed corresponding to the contact hole 135 and the overcoat 160 is formed below the lower electrode 170, the via hole 167 may be formed in the overcoat 160 smaller than the contact hole 135. Thus, a depth of the via hole 167 increases and a diameter of the via hole 167 gradually decreases, thus the photoresist layer in the via hole 167 may not be completely exposed when patterning the photoresist.

Therefore, photoresist may remain in the via hole 167 after patterning, and the reflective layer 171 may not be removed from the via hole 167 due to the remaining photoresist when the reflective layer 171 is subsequently patterned. Therefore, this may cause a pattern defect of the lower electrode 170. Additionally, when the via hole 167 has a small size, the contact between the drain electrode 145 and the lower electrode 170 may be defective, thereby increasing the contact resistance.

SUMMARY OF THE INVENTION

The present invention provides an organic light emitting display (OLED) that may prevent a patterning defect on a lower electrode, and improve processing stability and reliability of a device by forming a via hole to be larger than a contact hole in a structure where the via hole is formed corresponding to the contact hole.

Additional features of the invention will be set forth in the description which follows, and in part will be apparent from the description, or may be learned by practice of the invention.

The present invention discloses a flat panel display including a semiconductor layer formed on a substrate, a first insulating layer formed on the substrate and including a contact hole, an electrode formed on the first insulating layer and coupled to the semiconductor layer through the contact hole, a second insulating layer formed on the first insulating layer and including a via hole, and a pixel electrode formed on the second insulating layer and coupled to the electrode through the via hole. The via hole is formed corresponding to the contact hole, and the via hole has a size that is larger than the contact hole.

The present invention also discloses a flat panel display including a first conductive layer formed on a substrate, a first insulating layer formed on the substrate and having a first opening portion, a second conductive layer formed on the first insulating layer and electrically connected to the first conductive layer through the first opening portion, a second insulating layer formed on the substrate and including a second opening portion, and a third conductive layer formed on the second insulating layer and electrically connected to the second conductive layer through the second opening portion. The third conductive layer includes at least a reflective layer having a third opening portion that exposes a part of the second conductive layer. At least a portion of a plan view area of the first opening portion is within a plan view area of the second opening portion, and the second opening portion has a larger size than the first opening portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
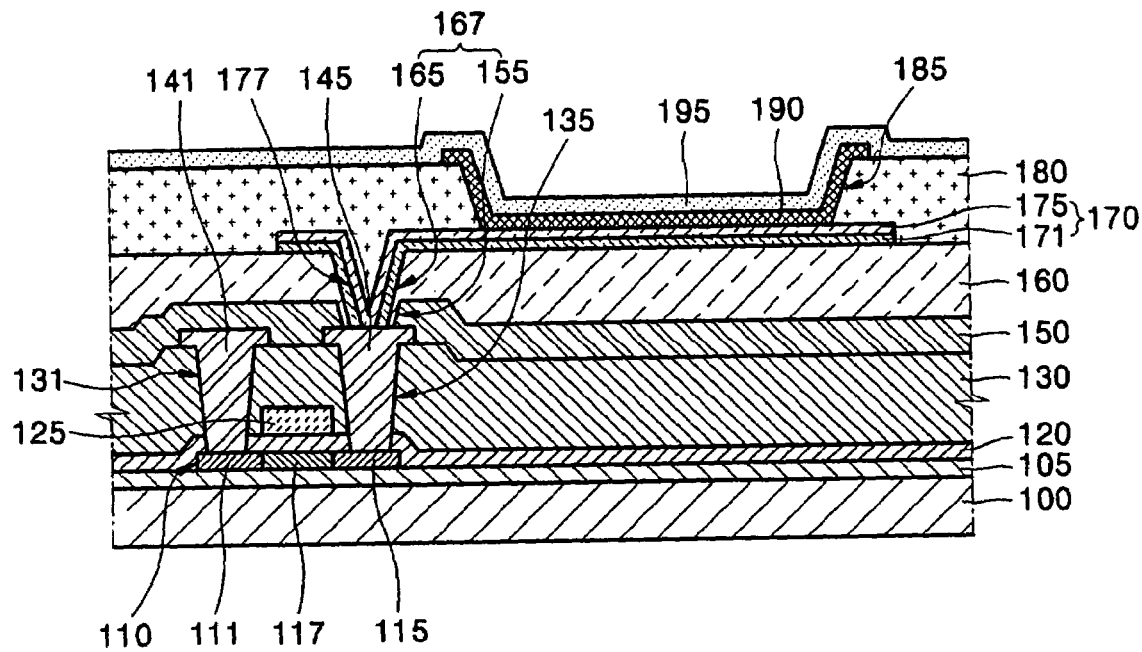
FIG. 1 is a cross-sectional view showing a conventional organic light emitting display (OLED).
Figure 2A:
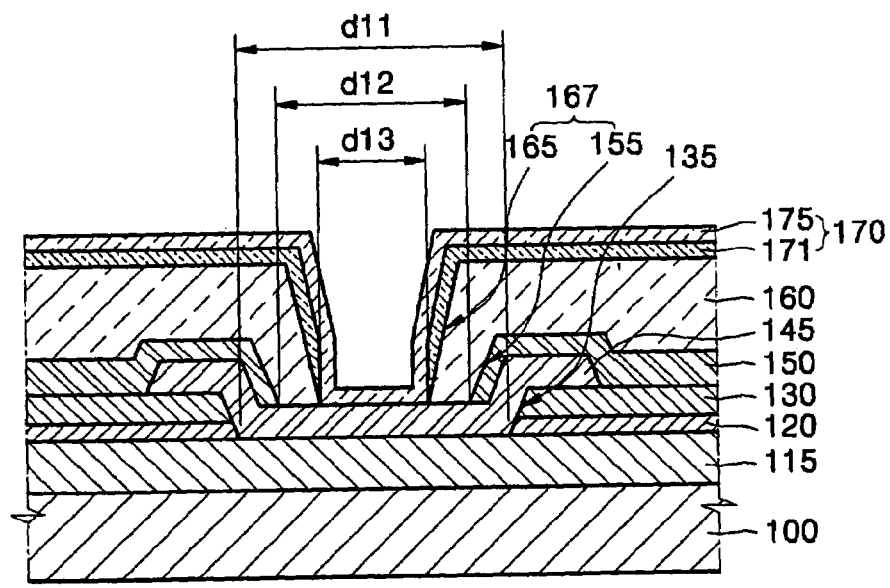
FIG. 2A is a cross-sectional view showing a portion of the OLED of FIG. 1 having a contact hole and a via hole.
Figure 2B:
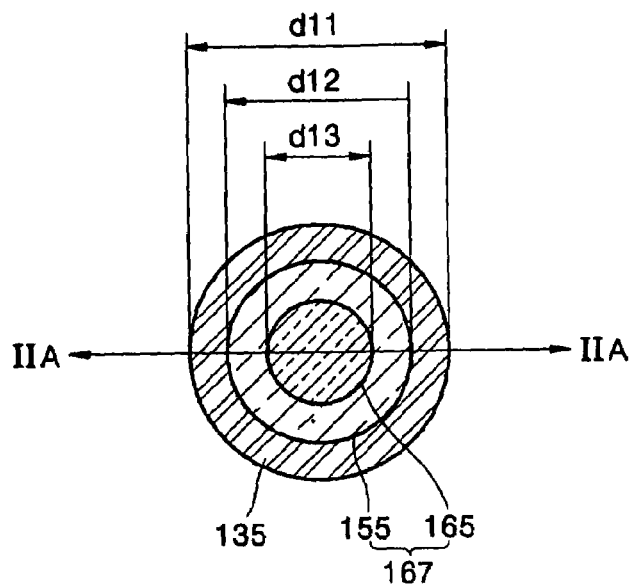
FIG. 2B is a plan view showing the contact hole and the via hole in the OLED of FIG. 1.
Figure 3:
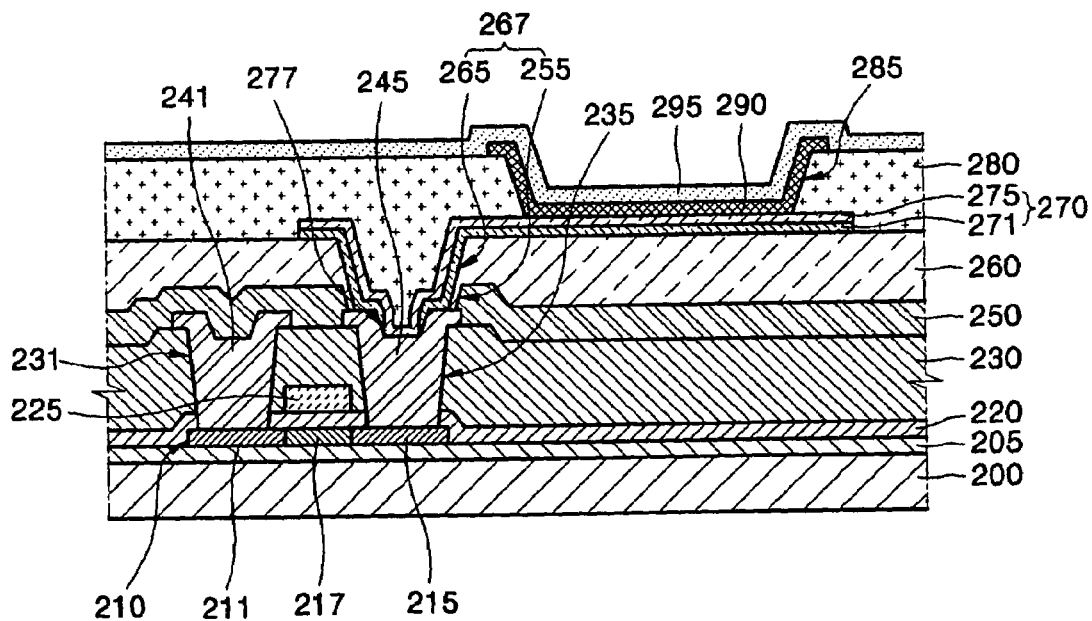
FIG. 3 is a cross-sectional view showing an OLED according to an exemplary embodiment of the present invention.

FIG. 3 is a cross-sectional view showing an organic light emitting display (OLED) according to an exemplary embodiment of the present invention.

Referring to FIG. 3, a buffer layer 205 may be formed on an insulating substrate 200, and a semiconductor layer 210 is formed on the buffer layer 205. The semiconductor layer 210 may be formed of a polycrystalline silicon (polysilicon) film. The buffer layer 205 prevents impurities on the substrate from infiltrating the semiconductor layer 210, and it may include one or more oxide or nitride layers.

A gate insulating layer 220 may be deposited on the semiconductor layer 210 and the buffer layer 205, and a material for forming a gate electrode is deposited on the gate insulating layer 220 and patterned to form a gate electrode 225 at a location corresponding to the semiconductor layer 210. Additionally, impurities such as, for example, p-type impurities, are injected into the semiconductor layer 210 to form a source region 211 and a drain region 215. A region between the source region 211 and the drain region 215, where impurities are not doped, functions as a channel region 217 of a thin film transistor (TFT).

After depositing an interlayer dielectric 230 on the gate electrode 225 and the gate insulating layer 220, the interlayer dielectric 230 and the gate insulating layer 220 may be etched to form contact holes 231 and 235 that expose the source region 211 and the drain region 215, respectively, of the semiconductor layer 210. A material for forming source and drain electrodes, such as, for example, MoW may be deposited on the interlayer dielectric 230 including the contact holes 231 and 235 and then patterned to form a source electrode 241 and a drain electrode 245. The source and drain electrodes 241 and 245 are electrically connected to the source and drain regions 211 and 215 through the contact holes 231 and 235, respectively.

A protective layer 250 may be deposited on the interlayer dielectric 230 and the source and drain electrodes 241 and 245 and then patterned to form a first opening portion 255 that exposes either the source electrode 241 or the drain electrode 245. FIG. 3 shows, for example, the first opening portion 255 exposing a part of the drain electrode 245. The protective layer 250 may comprise an inorganic insulating layer such as, for example, a nitride layer or an oxide layer.

An organic insulating layer, such as, for example, benzocyclobutene (BCB) may be deposited on the protective layer 250 including the first opening portion 255 as an overcoat 260 and then patterned to form a second opening portion 265 that exposes a part of the drain electrode 245.

Additionally, a reflective layer 271 such as, for example, an AlNd layer, may be deposited on the overcoat 260 including a via hole 267 and then patterned to form the reflective layer 271 including a third opening portion 277 that exposes a part of the drain electrode 245 in the via hole 267. A transparent conductive layer 275 such as, for example, an indium tin oxide (ITO) layer, may be deposited on the reflective layer 271 and the overcoat 260 and then patterned to form a lower electrode 270. Accordingly, the lower electrode 270 may include the reflective layer 271 and the transparent conductive layer 275, and the transparent conductive layer 275 may electrically contact the drain electrode 245 through the via hole 267 by the third opening portion 277 formed on the reflective layer 271.

A pixel defining layer 280, including a fourth opening portion 285 that exposes a part of the lower electrode 270, may be formed on the lower electrode 270 and the overcoat 260. Additionally, an organic layer 290, including at least a light emitting layer, may be formed on the lower electrode 270 and the overcoat 260 in the fourth opening portion 285, and an upper electrode 295, which may act as a cathode electrode, may be formed on the substrate.

Figure 4A:
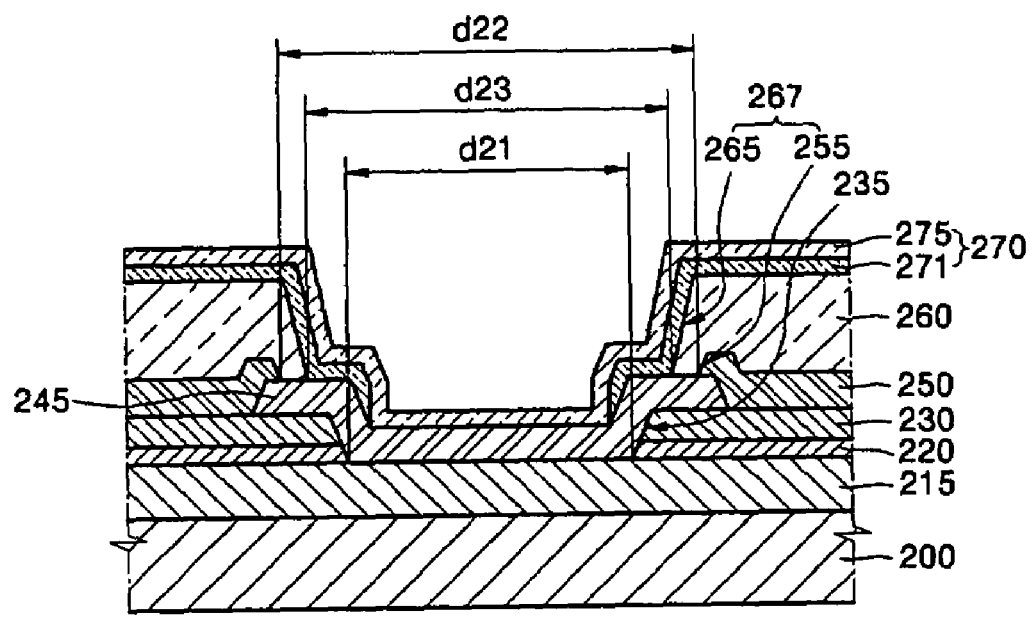
FIG. 4A is a cross-sectional view showing a portion of the OLED of FIG. 3 having a contact hole and a via hole.
Figure 4B:
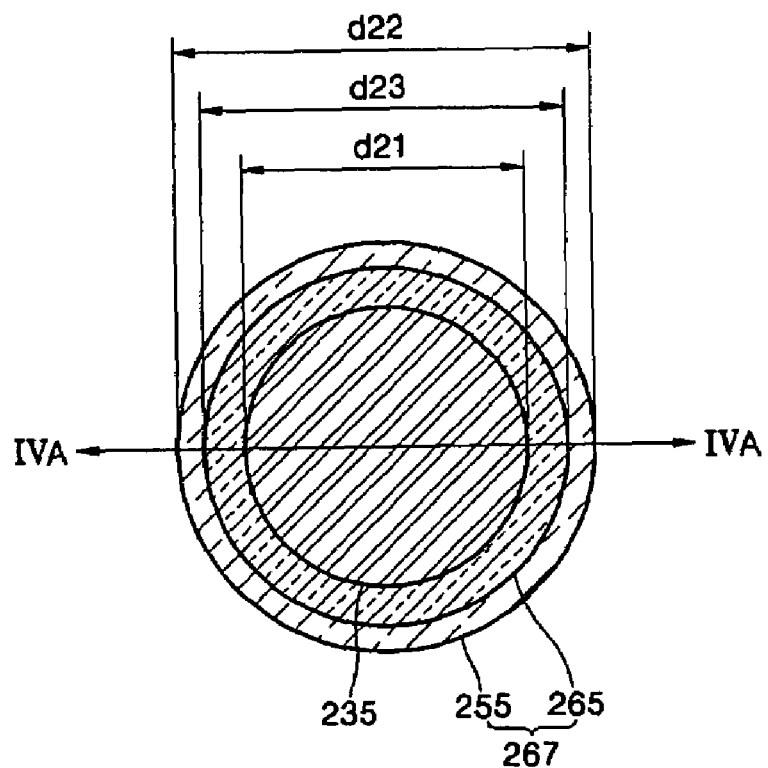
FIG. 4B is a plan view showing the contact hole and the via hole in the OLED of FIG. 3.

FIG. 4A is a cross-sectional view along line IVA-IVA of FIG. 4B showing a portion corresponding to the contact hole and the via hole in the OLED of FIG. 3, and FIG. 4B is a plan view showing the contact hole and the via hole in the OLED of FIG. 3.

Referring to FIG. 4A and FIG. 4B, the OLED according to an exemplary embodiment of the present invention may have a circular-shaped contact hole 235 and via hole 267, and the plan view area of the contact hole 235 is contained within the plan view area of the via hole 267. The contact hole 235 electrically connects the drain electrode 245 to the drain region 215 of the semiconductor layer 210, and it has a size d21. Additionally, the via hole 267 electrically connects the lower electrode 270 to the drain electrode 245, and it includes the first opening portion 255, which is formed in the protective layer 250 and has a size d22, and the second opening portion 265, which is formed in the overcoat 260 and has a size d23.

Here, the size d21 of the contact hole 235 is a cross-sectional length of the portion of the drain region 215 that is exposed by the contact hole 235, the size d22 of the first opening portion 255 is a cross-sectional length of the portion of the drain electrode 245 that is exposed by the first opening portion 255, and the size d23 of the second opening portion 265 is a cross-sectional length of the portion of the drain electrode 245 that is exposed by the second opening portion 265.

Additionally, the size of the via hole 267 is a cross-sectional length of the portion of the drain electrode 245 that is exposed by the via hole 267. Here, since the second opening portion 265 is smaller than the first opening portion 255 (i.e. the overcoat 260 covers the protective layer 250), the size d23 of the second opening portion 265 determines the size of the via hole 267.

Referring to FIG. 4A and FIG. 4B, the size d23 of the second opening portion 265 is larger than the size d21 of the contact hole 235, and the size d22 of the first opening is portion 255 is larger than the size d23 of the second opening portion 265. Consequently, the via hole 267 is larger than the contact hole 235.

Additionally, the lower electrode 270 may contact the drain electrode 245 at a shallow portion of the via hole 267, that is, at a portion corresponding to the interlayer dielectric 230. Thus, in patterning the reflective layer 271 of the lower electrode 270, the stability for performing processes can be ensured, and the defective contact between the drain electrode and the lower electrode may be prevented, thereby preventing an increase in the contact resistance.

Figure 5A:
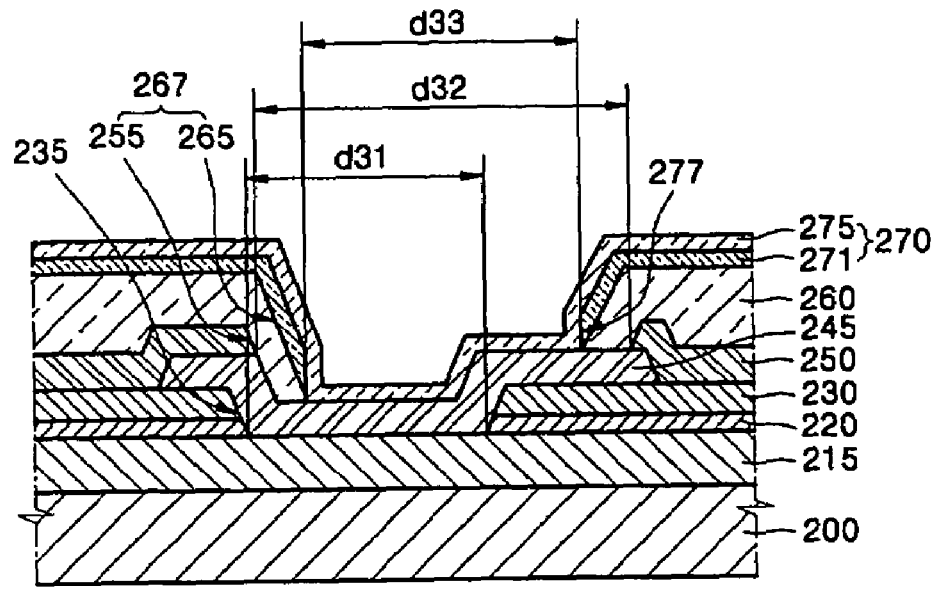
FIG. 5A is a cross-sectional view showing a portion of an OLED having a contact hole and a via hole according to another exemplary embodiment of the present invention.
Figure 5B:
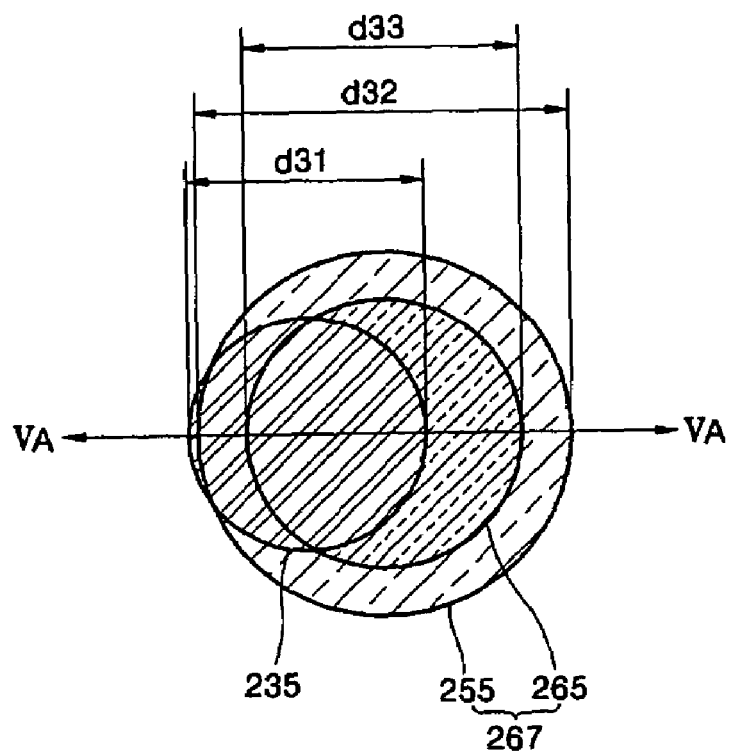
FIG. 5B is a plan view showing the contact hole and the via hole in the OLED of FIG. 5A.

FIG. 5A is a cross-sectional view along line VA-VA of FIG. 5B showing an OLED according to another embodiment of the present invention, and FIG. 5B is a plan view showing the OLED of FIG. 5A.

The structure of the OLED of FIG. 5A is similar to that of the OLED of FIG. 3. However, in the OLED of FIG. 3, the plan view area of the contact hole 235 is contained within the plan view area of the via hole 267, but in the OLED of FIG. 5A and FIG. 5B, the plan view area of the via hole 267 overlaps the plan view area of the contact hole 235. Therefore, the structures of the via hole 267 and the contact hole 235 will be described.

Referring to FIG. 5A and FIG. 5B, the contact hole 235, having a size d31, exposes the drain region 215 of the semiconductor layer 210 and is formed in the gate insulating layer 220 and the interlayer dielectric 230. The via hole 267 is formed in the protective layer 250 and the overcoat 260, and it includes the first opening portion 255, which is formed in the protective layer 250 and has a size d32 and that exposes a part of the drain electrode 245, and a second opening portion 265, which is formed in the overcoat 260 and has a size d33 and that also exposes a part of the drain electrode 245.

The size d32 of the first opening portion 255 is larger than the size d31 of the is contact hole 235, and the first opening portion 255 overlaps the contact hole 235. Additionally, the size d33 of the second opening portion 265 is larger than the size d31 of the contact hole 235 and smaller than the size d32 of the first opening portion 255, and the second opening portion overlaps the contact hole 235.

Figure 6A:
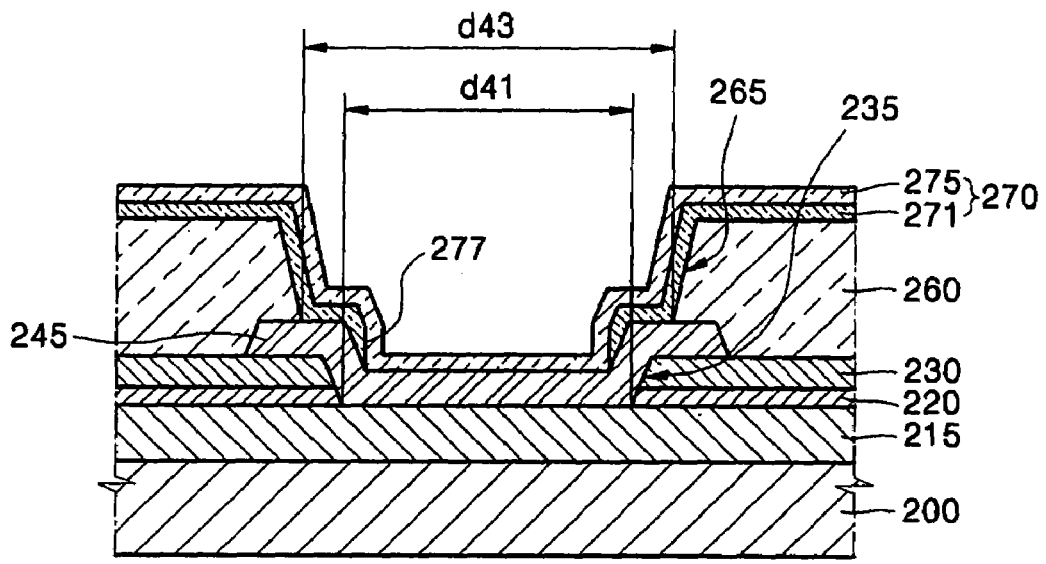
FIG. 6A is a cross-sectional view showing a portion of an OLED having a contact hole and a via hole according to another exemplary embodiment of the present invention.
Figure 6B:
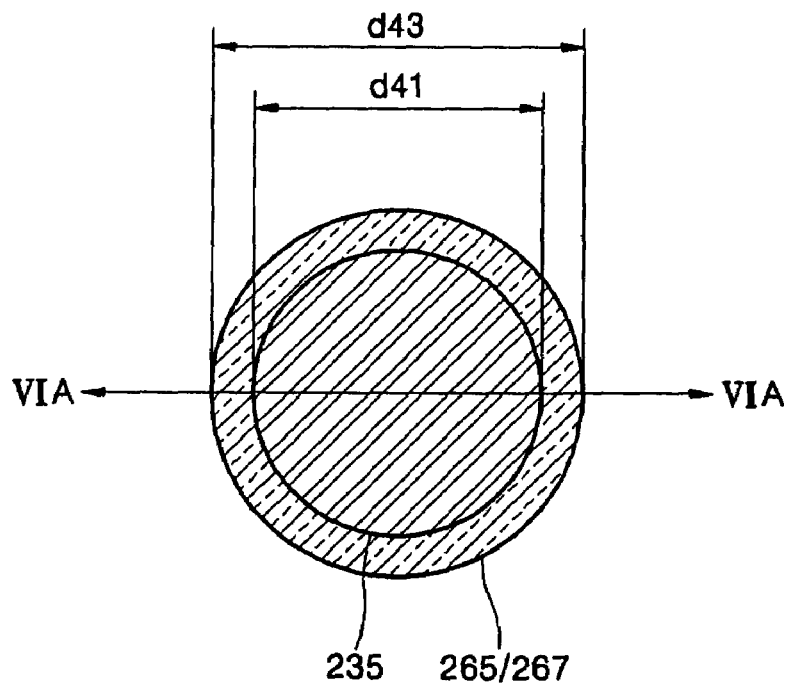
FIG. 6B is a plan view showing the contact hole and the via hole in the OLED of FIG. 6A.

FIG. 6A is a cross-sectional view along line VIA-VIA of FIG. 6B showing a portion corresponding to a contact hole and a via hole of an OLED according to another embodiment of the present invention, and FIG. 6B is a plan view showing the contact hole and the via hole in the OLED of FIG. 6A.

The structure of the OLED of FIG. 6A is similar to that of the OLED of FIG. 3. However, in the OLED of FIG. 3, the protective layer 250 and the overcoat 260 are stacked between the source and drain electrodes 241 and 245 and the lower electrode 270. However, in the OLED of FIG. 6A and FIG. 6B, only the overcoat 260 is disposed between the source and drain electrodes 241 and 245 and the lower electrode 270. In other words, the protective layer 250 is omitted in the embodiment shown in FIG. 6A. Thus, the structures of the via hole 267 and the contact hole 235 will be described.

Referring to FIG. 6A and FIG. 6B, the OLED may include the circular-shaped contact hole 235 and via hole 267, and the plan view area of the contact hole 235 is contained within the plan view area of the via hole 267. The contact hole 235 electrically connects the drain electrode 245 to the drain region 215 of the semiconductor layer 210, and it has a size d41. Additionally, the via hole 267 electrically connects the lower electrode 270 to the drain electrode 245, and it includes an opening portion 265 that is formed in the overcoat 260 with a size d43.

As FIG. 6A and FIG. 6B show, the size d43 of the via hole 267 is larger than the size d41 of the contact hole 235. Thus, the via hole 267 is larger than the contact hole 235, and the lower electrode 270 may contact the drain electrode 245 at a shallow portion of the via hole is 267, that is, at a portion corresponding to the interlayer dielectric 230.

The OLED shown in FIG. 6A and FIG. 6B may be applied to the structure in which the plan view area of the via hole overlaps the plan view area of the contact hole, as shown in FIG. 5A and FIG. 5B.

According to embodiments of the present invention, the plan view area of a third opening portion 277, which is formed on the reflective layer 271 of the lower electrode 270, may be contained within, or it may overlap, the plan view area of the contact hole 235, and the size of third opening portion 277 may be formed regardless of the size of contact hole. Further, the plan view area of the third opening portion 277 may be contained within the plan view area of the contact hole 235 and the plan view area of the via hole 267.

According to an exemplary embodiment of the present invention, a protective layer is deposited and patterned to form the first opening portion, and the overcoat is deposited and pattern to form the second opening portion. Hence, the via hole having different-sized first and second opening portions is formed through two etching processes. However, the present invention is not limited thereto. For example, the present invention may be applied to the case where the via hole has same-sized first and second opening portions formed through two etching processes, and the case where the via hole has one opening portion formed by patterning the protective layer and the overcoat with one etching process after depositing the protective layer and the overcoat.

In the OLED according to exemplary embodiments of the present invention, the via hole is formed corresponding to the contact hole, and the lower electrode has the opening portion that is overlapped with the via hole. However, the present invention may also be applied to a case where the multi-conductive layers are disposed, openings for connecting the conductive is layers are overlapped with each other, the overcoat is formed between the conductive layers, and the conductive layer formed on the overcoat is patterned.

Additionally, in the OLED according to embodiments of the present invention, the via hole and the contact hole have circular shapes. However, the present invention may be applied any type of structures, if it prevents the patterning defect by forming the via hole to be larger than the contact hole in a structure where the via hole is formed corresponding to the contact hole and either the source electrode or drain electrode is exposed.

According to exemplary embodiments of the present invention, since the via hole is larger than the contact hole, the defective contact between the drain electrode and the lower electrode may be prevented, thereby reducing the contact resistance. Additionally, the stability of the process for patterning the lower electrode can be ensured to prevent the patterning defect of the lower electrode, thereby improving the device's reliability.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A flat panel display, comprising:
a semiconductor layer formed on a substrate;
a first insulating layer formed on the substrate and including a contact hole;
an electrode formed on the first insulating layer and coupled to the semiconductor layer through the contact hole;
a second insulating layer formed on the first insulating layer and including a via hole; and
a pixel electrode formed on the second insulating layer and coupled to the electrode through the via hole,
wherein the via hole is formed corresponding to the contact hole and has a size larger than the contact hole, and
wherein the pixel electrode comprises:
a reflective layer arranged on the second insulating layer, and
a transparent conductive layer arranged on the reflective layer,
wherein the reflective layer comprises a first opening portion that exposes the electrode, and the transparent conductive layer is coupled to the electrode through the first opening portion.

2. The flat panel display of claim 1, wherein the second insulating layer comprises a protective layer and an overcoat layer, the via hole being formed in the protective layer and the overcoat layer.

3. The flat panel display of claim 1, wherein the second insulating layer comprises:
a protective layer formed on the first insulating layer and including a second opening portion that exposes the electrode; and
an overcoat layer formed on the protective layer and including a third opening portion that exposes the electrode,
wherein the via hole includes the second opening portion and the third opening portion, and the second opening portion and the third opening portion have a larger size than the contact hole.

4. The flat panel display of claim 3, wherein a size of the second opening portion is greater than or equal to a size of the third opening portion.

5. The flat panel display of claim 1, wherein the second insulating layer comprises an overcoat layer including an opening portion that exposes the electrode, and the via hole includes the opening portion, the opening portion having a larger size than the contact hole.

6. The flat panel display of claim 1, wherein the electrode is a drain electrode of a thin film transistor.

7. The flat panel display of claim 1, wherein:
a plan view area of the via hole overlaps a plan view area of the contact hole; and
at least a portion of a plan view area of the first opening portion is within the plan view area of the contact hole and the plan view area of the via hole.

8. The flat panel display of claim 7, wherein the second insulating layer comprises a protective layer and an overcoat layer, and the via hole is formed in the protective layer and the overcoat layer.

9. The flat panel display of claim 7, wherein the second insulating layer comprises:
a protective layer formed on the first insulating layer and including a second opening portion that exposes the electrode; and an overcoat layer formed on the protective layer and including a third opening portion that exposes the electrode, wherein the via hole includes the second opening portion and the third opening portion, and the second opening portion and the third opening portion have a larger size than the contact hole.

10. The flat panel display of claim 9, wherein a size of the second opening portion is greater than or equal to a size of the third opening portion.

11. The flat panel display of claim 7, wherein the pixel electrode further includes a transparent conductive layer formed on the reflective layer, and the transparent conductive layer electrically contacts the electrode through the first opening portion.

12. The flat panel display of claim 7, wherein the electrode is a drain electrode of a thin film transistor.

13. A flat panel display, comprising:
a first conductive layer formed on a substrate;
a first insulating layer formed on the substrate and having a first opening portion;
a second conductive layer formed on the first insulating layer and coupled to the first conductive layer through the first opening portion;
a second insulating layer formed on the substrate and including a second opening portion; and
a third conductive layer formed on the second insulating layer and coupled to the second conductive layer through the second opening portion, the third conductive layer including a reflective layer having a third opening portion that exposes a part of the second conductive layer, the reflective layer arranged on the second insulating layer, and a transparent conductive layer arranged on the reflective layer and coupled to the second conductive layer through the third opening portion, wherein at least a portion of a plan view area of the first opening portion is within a plan view area of the second opening portion, and the second opening portion has a larger size than the first opening portion.

14. The flat panel display of claim 13, wherein the first insulating layer comprises an interlayer dielectric, and the second insulating layer comprises a protective layer and an overcoat layer.

15. The flat panel display of claim 13, wherein the plan view area of the second opening portion overlaps the plan view area of the first opening portion, and at least a portion of a plan view area of the third opening portion is within the plan view area of the first opening portion and the plan view area of the second opening portion.

16. The flat panel display of claim 13, wherein the first opening portion is a contact hole, and the second opening portion is a via hole.

17. The flat panel display of claim 13, wherein the plan view area of the first opening portion is contained within the plan view area of the second opening portion.

* * * * *